United States Patent
Brun

(10) Patent No.: US 9,953,953 B2
(45) Date of Patent: Apr. 24, 2018

(54) METHOD FOR ASSEMBLING A MICROELECTRONIC CHIP ELEMENT ON A WIRE ELEMENT, AND INSTALLATION ENABLING ASSEMBLY TO BE PERFORMED

(71) Applicant: COMMISSARIAT A L'ENERGIE ATOMIQUE ET AUX ENERGIES ALTERNATIVES, Paris (FR)

(72) Inventor: Jean Brun, Champagnier (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 708 days.

(21) Appl. No.: 14/375,859

(22) PCT Filed: Jan. 22, 2013

(86) PCT No.: PCT/FR2013/000022
§ 371 (c)(1),
(2) Date: Jul. 31, 2014

(87) PCT Pub. No.: WO2013/114009
PCT Pub. Date: Aug. 8, 2013

(65) Prior Publication Data
US 2015/0024589 A1    Jan. 22, 2015

(30) Foreign Application Priority Data

Jan. 31, 2012  (FR) ..................................... 12 00285

(51) Int. Cl.
*H05K 13/02*    (2006.01)
*H05K 13/06*    (2006.01)
(Continued)

(52) U.S. Cl.
CPC .............. *H01L 24/85* (2013.01); *H01L 24/06* (2013.01); *H01L 24/78* (2013.01); *H01L 24/05* (2013.01);
(Continued)

(58) Field of Classification Search
CPC . H01L 24/85; H01L 24/78; H01L 2224/8592; H01L 2224/85375;
(Continued)

(56) References Cited

U.S. PATENT DOCUMENTS 3,270,256 A    8/1966  Mills et al.
8,093,617 B2 *  1/2012  Vicard ................. G06K 19/027
                                    257/466
(Continued)

FOREIGN PATENT DOCUMENTS

EP    2 390 184 A1    11/2011
JP    A-2002-353267   12/2002
(Continued)

OTHER PUBLICATIONS

English translation of Jan. 22, 2017 Office Action issued in Chinese Patent Application No. 201380014804.0.
(Continued)

*Primary Examiner* — Peter DungBa Vo
*Assistant Examiner* — Kaying Kue
(74) *Attorney, Agent, or Firm* — Oliff PLC

(57) ABSTRACT

Method for assembling includes: providing a system to transfer wire element from wire element supply device to wire element storage device; stretching wire element between supply and storage devices by tensioning; providing an individualized reservoir and separated chip elements, each including a connection terminal including a top with free access facing in which chip element is not present; transporting the chip element from reservoir to an assembly
(Continued)

area between supply and storage devices in which wire element is tightly stretched in assembly area; fixing electrically conducting wire element to chip element connection terminal in assembly area; and adding electrically insulating material on chip element after latter has been fixed to wire element forming a cover, the addition of material being performed on surface of chip element including connection terminal fixed to wire element to cover at least the connection terminal and portion of wire element at fixing point of latter.

13 Claims, 3 Drawing Sheets

(51) Int. Cl.
*H05K 13/00* (2006.01)
*H01L 23/00* (2006.01)

(52) U.S. Cl.
CPC .............. *H01L 24/45* (2013.01); *H01L 24/48* (2013.01); *H01L 24/49* (2013.01); *H01L 2224/04042* (2013.01); *H01L 2224/0569* (2013.01); *H01L 2224/05601* (2013.01); *H01L 2224/0618* (2013.01); *H01L 2224/45099* (2013.01); *H01L 2224/4847* (2013.01); *H01L 2224/4918* (2013.01); *H01L 2224/7898* (2013.01); *H01L 2224/78611* (2013.01); *H01L 2224/78651* (2013.01); *H01L 2224/8592* (2013.01); *H01L 2224/85205* (2013.01); *H01L 2224/85375* (2013.01); *H01L 2224/85801* (2013.01); *H01L 2224/85805* (2013.01); *H01L 2224/85862* (2013.01); *H01L 2924/00014* (2013.01); *H01L 2924/12041* (2013.01); *H01L 2924/12042* (2013.01); *H01L 2924/181* (2013.01); *H01L 2933/0066* (2013.01)

(58) Field of Classification Search
CPC ..... H01L 2224/85805; Y10T 29/53174; Y10T 29/53178; Y10T 29/53183; Y10T 29/49169; Y10T 29/49171; Y10T 29/49172; Y10T 29/4913–29/49146; H05K 13/0417–13/0426; H05K 13/0452; H05K 13/046–13/0469; H05K 3/32–3/3494; H05K 3/303
USPC ........... 29/739, 740, 741, 854–856, 832–841
See application file for complete search history.

(56) References Cited

U.S. PATENT DOCUMENTS

| | | | |
|---|---|---|---|
| 8,258,011 B2* | 9/2012 | Brun | H01Q 1/2283 438/113 |
| 8,445,328 B2* | 5/2013 | Brun | H01L 23/49811 257/678 |
| 8,471,773 B2* | 6/2013 | Vicard | G06K 19/07786 343/702 |
| 9,112,079 B2* | 8/2015 | Vicard | H01L 31/048 |
| 9,179,586 B2* | 11/2015 | Brun | H01L 23/4985 |
| 9,378,864 B1* | 6/2016 | Liu | H01R 13/22 |
| 9,674,949 B1* | 6/2017 | Liu | H05K 1/0283 |
| 2003/0080918 A1 | 5/2003 | Forster et al. | |
| 2003/0119414 A1* | 6/2003 | Wei | H01L 51/56 445/24 |
| 2003/0215565 A1* | 11/2003 | Chang | H05K 3/125 427/8 |
| 2004/0059455 A1* | 3/2004 | Kawahara | H01L 21/67138 700/119 |
| 2007/0049156 A1* | 3/2007 | Lim | H01J 9/02 445/49 |
| 2007/0069341 A1* | 3/2007 | Usami | G06K 19/07718 257/666 |
| 2010/0117523 A1* | 5/2010 | Tchakarov | H01L 51/5215 313/504 |
| 2010/0136746 A1* | 6/2010 | Brun | H01L 25/0655 438/113 |
| 2011/0290200 A1 | 12/2011 | Chemin et al. | |

FOREIGN PATENT DOCUMENTS

WO WO 2009/013409 A2 1/2009
WO WO 2011/161336 A1 12/2011

OTHER PUBLICATIONS

Oct. 18, 2016 Office Action issued in Japanese Patent Application No. 2014-555281.

* cited by examiner

METHOD FOR ASSEMBLING A MICROELECTRONIC CHIP ELEMENT ON A WIRE ELEMENT, AND INSTALLATION ENABLING ASSEMBLY TO BE PERFORMED

BACKGROUND OF THE INVENTION

The invention relates to a method for assembling a microelectronic chip element on an electrically conducting wire element.

State of the Art

Numerous techniques exist at the present time to mechanically and electrically connect microelectronic chip elements to one another. A conventional technique consists in making a rigid mechanical connection between the chip elements, once the latter have been formed on a substrate and released by dicing. The chip elements, which are then fixed on a rigid support, are then electrically connected before a protective coating is formed. This approach, consisting in making the connection on a rigid support, is conventionally used when a great complexity in connection of the chip elements exists. It does however have the main drawback of using a rigid mechanical support which is particularly unsuitable for integration in flexible structures.

The document WO2009/013409 filed by the applicant describes the use of a silicon wafer on which independent chip elements are produced. The chip elements are electrically connected to one another via a wire element before being finally separated from one another, the whole operation being performed on the silicon wafer, which does not facilitate handling and association of a chip element with the wire element.

The document EP2390184 describes a machine enabling a daisy chain of chip elements each equipped with a groove to be formed. The wire element is then embedded in the groove which among other things enables protection of the latter to be performed.

SUMMARY OF THE INVENTION

It is thus sought to facilitate fabrication of a daisy chain comprising microelectronic chip elements, at low cost.

This object tends to be achieved by the fact that the method comprises the following steps:
  providing a transfer system of the wire element from a wire element supply device to a storage device of said wire element,
  stretching of the wire element between the supply device and the storage device by a tensioning device,
  providing a reservoir of individualized and separated chip elements, each chip element comprising a connection terminal, the connection terminal of each chip element comprising a top with free access facing which no part of the chip element is present,
  transporting a chip element from the reservoir to an assembly area located between the supply and storage devices in such a way that the wire element is tightly stretched in said assembly area,
  fixing the electrically conducting wire element to the connection terminal of the chip element in the assembly area,
  performing addition of an electrically insulating material on the chip element after the latter has been fixed to the wire element to form a cover, said addition of material being performed on the surface of the chip element comprising the connection terminal fixed to said wire element so as to cover at least the connection terminal and a portion of the wire element at the fixing point of the latter.

Advantageously, several chip elements are selectively transported from the reservoir one after the other to the assembly area so as to obtain, after a series of chip elements has passed through the assembly area, a daisy chain formed by the series of chip elements fixed to the wire element and spaced out along the wire element.

According to one embodiment, the addition of material designed to form the cover is performed by a nozzle configured to provide a jet of the electrically insulating material.

The fixing step of a chip element on the wire element is performed by sticking or by welding.

According to an alternative embodiment, the connection terminal of the chip element comprises:
  a bump making the electric connection with the chip of the chip element,
  a material different from the bump and covering the top of said bump, and the fixing step of the wire element is performed by modification of said material at the top of the bump to perform fixing thereof, and at least partially ensure the electric contact between the bump and the wire element.

Advantageously the material at the top of the bump wets an external surface of the wire element during the welding step.

In the case where fixing is performed by sticking, the material at the top of the bump can be a polymer charged with electrically conducting particles, and the fixing step comprises a mechanical stressing between the wire element and said polymer so as to compress it between the wire element and the bump to make an electric contact between the bump and the wire element by pinching of an electrically conducting particle of the polymer, or of a cluster of electrically conducting particles of the polymer.

Advantageously, during the fixing step of the wire element onto the connection terminal, the wire element is securely held against the material by biasing said wire element in the direction of the bump and heating the wire element to soften the material.

The addition of material can be calculated so as to homogenize the volume of the assembly formed by the cover, the segment of the wire element sunk in the cover and the chip element around the axis of the wire element, after fixing has been performed.

According to an alternative embodiment, the material addition step is performed before the wire element is stored in the storage device, or a storage step of the wire element, on which at least one chip element is fixed, in the storage device is performed before the material addition step.

The invention also relates to an installation for performing assembly of a microelectronic chip element on an electrically conducting wire element, the installation comprising:
  a reservoir containing individualized and separated chip elements, each chip element comprising a connection terminal, the connection terminal of each chip element comprising a top with free access facing which no part of the chip element is present,
  a transfer system for running a wire element from a wire element supply device to a storage device of said wire element so that the wire element passes through an assembly area,
  a tensioning device of the wire element between the supply device and the storage device, a device to selectively transport a chip element from the reservoir to the assembly area, a device for fixing the wire element to the connection terminal of said chip element, in the assembly area, a device for depositing an electrically insulating material on the chip element after fixing of the latter to the wire element so as to form a cover at the location of the fixing between the wire element and the connection terminal.

The device for fixing can comprise an element designed to heat the wire element in the assembly area to perform fixing.

The device for depositing can comprise a projection nozzle configured to occupy a projection position in which it is arranged facing the surface of the chip element on which the cover has to be formed.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

As indicated in the foregoing, it is sought to advantageously produce a daisy chain having a base formed by a series of microelectronic chip elements (or at least one chip element) assembly of which is solidified by addition of coating material forming the cover.

Figure 1:
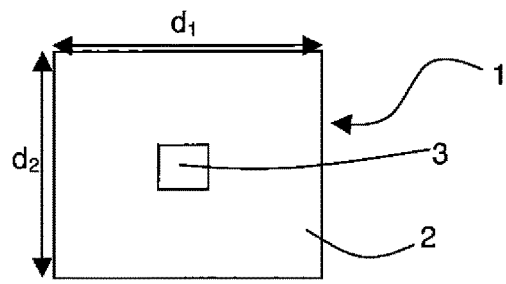
FIG. 1 illustrates a top view of a microelectronic chip element.
Figure 2:
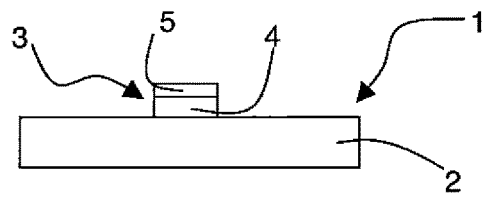
FIG. 2 illustrates a side view of a microelectronic chip element according to FIG. 1.

An example of a microelectronic chip element able to be used in the scope of the present invention is visible in FIGS. 1 and 2. Such a microelectronic chip element 1 can comprise a base 2 containing for example the chip or constituting the chip, and a connection terminal 3 advantageously salient from the external surface of base 2.

According to a particular embodiment, base 2 of chip element 1 is of substantially parallelepipedic shape. Connection terminal 3 is salient from one of the surfaces of base 2, advantageously from a surface called main surface. The main surface is defined as the surface having the largest lateral dimensions $d_1$ and $d_2$, in other words it is the surface having the largest surface area. In the case of a parallelepiped, base 2 comprises two opposite main surfaces.

In order to facilitate production of the daisy chain and to reduce costs, chip element 1 comprises at least one connection terminal 3 access to which is facilitated, or several connection terminals 3 access to which is facilitated. In global manner, what is meant by "facilitated access" is a chip element as described above as illustrative example, or in any other form, wherein no part of chip element 1 is facing the top of connection terminal 3, which leaves total freedom of access to connection terminal 3.

Advantageously, each connection terminal 3 of a chip element 1 comprises a bump 4 performing electric connection with chip 2 of chip element 1. The material 5, different from bump 4, at least partially covers the top of said bump 4. The top is defined as being the end of bump 4 opposite base 2 on which said bump 4 is placed. This different material 5 situated at the top of bump 4 is designed to facilitate and to improve the electric contact with a wire element associated with chip element 1.

Preferably, apart from salient connection terminal 3, the surface of base 2 supporting said connection terminal 3 is totally free (with the exception of possible additional connection terminal(s) 3).

Figure 3:
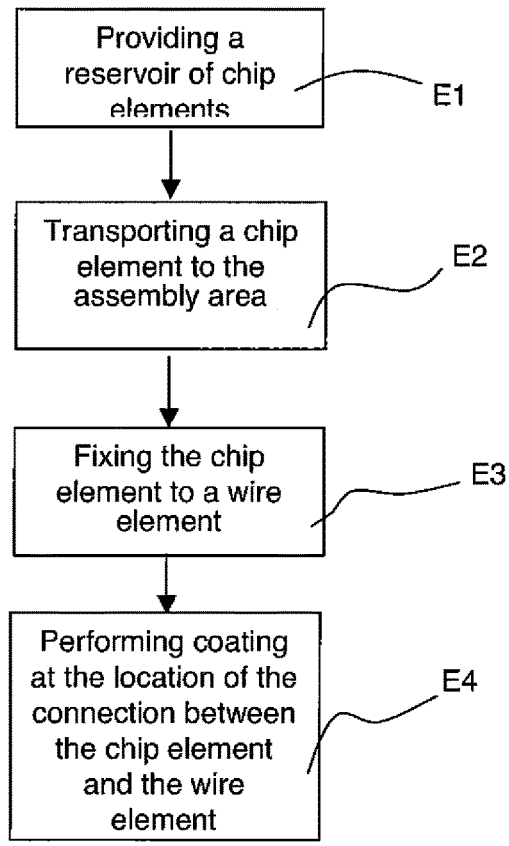
FIG. 3 illustrates the different steps of a method enabling chip elements to be associated with a wire element.
Figure 4:
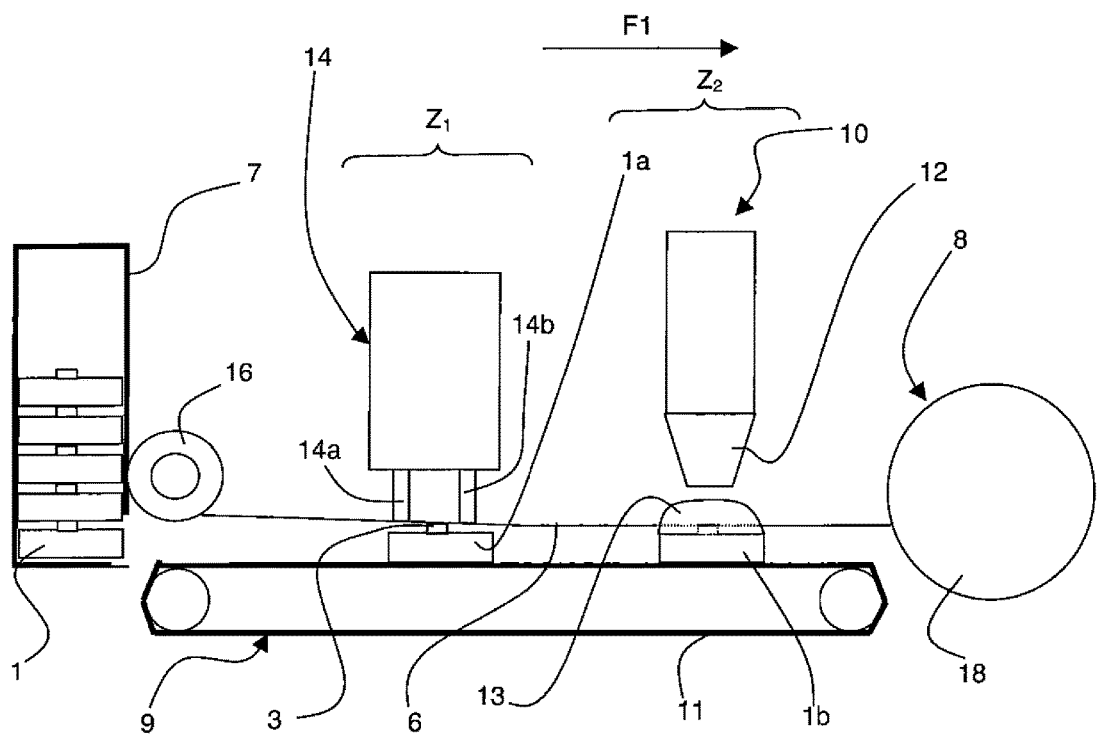
FIG. 4 illustrates an embodiment of a machine enabling the method to be implemented.

The method illustrated in FIGS. 3 and 4 is particularly suitable for assembly of a chip element 1 (preferably of a type as defined above) on an electrically conducting wire element 6. The method can thus comprise a step E1 in which a reservoir 7 of individualized and separate chip elements 1 is provided. Each chip element comprises a connection terminal 3, and connection terminal 3 of each chip element 1 comprises a top with free access facing which no part of chip element 1 is present. What is meant by "individualized and separate" is that the chip elements are not connected to one another by any securing element, for example of temporary support type. This reservoir 7 can for example contain chip elements 1 as described above either unsorted or ordered to facilitate distribution. A chip element can then be transported (step E2) from reservoir 7 to an assembly area $Z_1$ where an electrically conducting wire element 6 is fixed (step E3) to connection terminal 3 of chip element 1a. This connection is naturally designed to electrically connect the chip of chip element 1a to wire element 6. To perform movement of wire element 6, a transfer system is provided for running wire element 6 from a supply device 16 of wire element 6 (for example a reel) to a storage device 18 of said wire element 6 (for example a coiling system). In the course of the method, wire element 6 is stretched between supply device 16 and storage device 18 by a tensioning device. Tensioning can be applied from the supply device to the storage device or in particular areas of the running path between the two points. It is also possible to have different wire element tensions along the running path.

Tensioning can for example be performed by supply and storage devices 16, 18 themselves, or by any type of tensioning of a wire element between two points able to be implemented by the person skilled in the art. Assembly area $Z_1$ is situated between supply device 16 and storage device 18 so that wire element 6 is kept taut in this area. In advantageous manner, the wire element is rectilinear in assembly area $Z_1$ to facilitate fixing of the chip element.

In an alternative embodiment, the wire element is rectilinear between the supply device and storage device, but it is also possible to have a running path representing broken lines, the wire element being rectilinear in assembly area $Z_1$.

Advantageously, wire element 6 fixed to chip element 1 will be intended to be incorporated in a fabric, or in other systems, requiring handling thereof. The protuberances of the assembly can thus catch and give rise to problems in particular of breaking of chip element 1 during handling of the latter. A problem of improving fixing thus arises. This problem can be solved by providing an addition (step E4 of FIG. 3) of electrically insulating material on chip element 1b after the latter has been fixed to wire element 6 to form a cover 13, said addition of material being performed on the surface of chip element 1 comprising connection terminal 3 fixed to said wire element 6 so as to cover at least connection terminal 3 and a portion of wire element 6 at the location where fixing is performed (i.e. the area where wire element 6 is secured to connection terminal 3). This material is electrically insulating as it will prevent short-circuiting at the connection terminal 3, in particular in the case where a single surface designed to receive the material comprises several connection terminals 3. This addition of material can be assimilated to at least partial coating of corresponding chip element 1. Among other things it makes it possible to form a cover, preferably of rounded shape, for protection of the fixing. In addition to the notion of protection, cover 13 enables the assembly between wire element 6 and the associated chip element 1 to be solidified.

Cover 13 advantageously covers the whole free surface of the surface supporting the connection terminal(s) and the wire element where the latter is fixed to the connection terminal. In this configuration, cover 13 advantageously presents a complex external surface limiting catching with an external element when handling of the daisy chain is performed.

This method can be implemented by an installation enabling assembly of a microelectronic chip element 1 to be performed on electrically conducting wire element 6 as illustrated in FIG. 4 and comprising reservoir 7 containing individualized chip elements 1 separate from one another of the type described in the foregoing, a system 8 for making a wire element 6 run, advantageously in taut manner, in an assembly area $Z_1$, a device 9 for selectively transporting a chip element 1a from the reservoir to assembly area $Z_1$ to assemble it with wire element 6, a device 14 for fixing wire element 6 to a connection terminal 3 of chip element 1a located in area $Z_1$, and a device 10 for depositing an electrically insulating material on chip element 1b after the latter has been fixed to wire element 6, thereby performing the above-mentioned coating so as to form cover 13 at the location of the fixing between wire element 6 and connection terminal 3.

In order to perform tensioning of wire element 6 in assembly area $Z_1$, the installation can comprise a device for tensioning the wire element between the supply device and the storage device. Between supply device 16 and storage device 18, wire element 6 thus passes through assembly area $Z_1$ in taut manner. Transfer system 8 makes wire element 6 run from supply device 16 of wire element 6 to storage device 18 of said wire element 6, so that wire element 6 passes through assembly area $Z_1$.

The tensioning device can be directly formed by supply device 16 and storage device 18 which are then configured to provide the tension. The same is the case for the transfer system which can then be formed by supply device 16 and storage device 18 which are then configured to perform transfer. It is also possible to have a tensioning device which does not make use of the supply device, for example by means of an intermediate part which rubs on the wire element in order to perform tensioning or by means of a wheel around which the wire element is wound.

In yet another alternative embodiment, the tensioning device can be achieved without the storage device, for example by means of an intermediate wheel. The storage device can be a wheel or a reservoir.

In FIG. 4, reservoir 7 is in the form of an element in which a plurality of chip elements 1 are stacked. Chip element 1 at the bottom of the pile is the first to exit from reservoir 7 so that the subsequent steps of the method can be applied.

Device 9 for selectively transporting a chip element to the assembly area can be in the form of a conveyor equipped with a rotary belt 11 in the form of a loop. Naturally, it can also be in the form of an arm designed to select a chip element from reservoir 7 and to place it in assembly area $Z_1$. The person skilled in the art will be able to add any type of suitable device 9.

In the embodiment described above, the general example of a chip element 1 fixed to a wire element 6 has been given. Naturally, the person skilled in the art can according to the same principle fix a plurality of chip elements 1 onto a single wire element 6 so as to form a daisy chain of chip elements 1. In other words, several chip elements 1 can be selectively transferred from reservoir 7 one after the other to assembly area $Z_1$ so as to obtain, after a series of chip elements have passed through assembly area $Z_1$, a daisy chain formed by the series of chip elements 1 fixed onto wire element 6 and spaced out along wire element 6. The spacing can be performed as desired according to the requirements of the person skilled in the art.

In the method and/or installation, addition of electrically insulating material to form cover 13 can be performed by a nozzle 12 configured to provide a jet of said electrically insulating material. In other words, device 10 can comprise a projection nozzle 12 configured to occupy a projection position in which it is arranged facing the surface of the chip element on which cover 13 has to be formed. In FIG. 4, this nozzle 12 of device 10 enables the electrically insulating material to be deposited by projection on chip element 1b, after the latter has been fixed to wire element 6 referred to above, for example in a coating area $Z_2$ down-line from area $Z_1$ in the direction $F_1$ of running of wire element 6. The nozzle is advantageous as it enables the quantity of electrically insulating material projected to form cover 13 to be controlled with precision. The person skilled in the art will naturally be able to replace nozzle 12 by any suitable device such as for example a pad configured to selectively occupy two positions. In a first position the pad takes the material from the material source, and in a second position the pad comes into contact with chip element 1b in area $Z_2$ to deposit the material thereon and form cover 13.

In the different cases, the material is advantageously in liquid or viscous state at the time it is applied, and then goes to a solid state to solidify the assembly of the wire element and the chip element, thereby forming cover 13.

Figure 5:
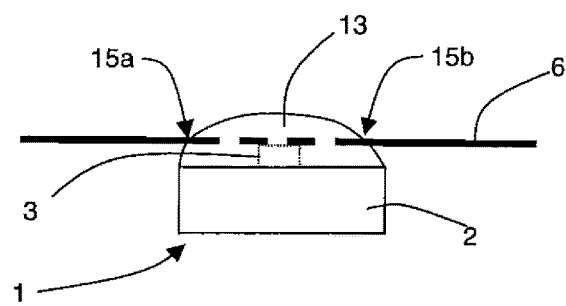
FIG. 5 illustrates in detail a wire element associated with a chip element covered by a cover.

This application of material enables an assembly to be achieved formed by the solidified material forming cover 13, chip element 1, and a segment of wire element 6 sunk in cover 13. Advantageously, the quantity of material applied is calculated so as to homogenize/recentre the volume of the assembly around the axis of wire element 6. This advantageously makes it possible to tend towards an axial symmetry of the external shapes of the assembly to facilitate for example covering of the wire element at the level of fixing of the latter with a chip element 1 or handling of the daisy chain. In other words, in FIG. 5, wire element 6 advantageously exits from cover 13 at the level of two opposite points 15a, 15b. These two points 15a, 15b virtually form a straight line comprised in a first plane substantially parallel to the plane of the surface of base 2 of chip element 1 bearing the associated connection terminals 3. Advantageously, the volume of the assembly formed by chip element 1, cover 13 and the segment of wire element 6 encapsulated by cover 13 is distributed in homogenous manner on each side of the first plane and advantageously on each side of a second plane perpendicular to the first plane and also comprising the virtual straight line.

Advantageously, the fixing step of a chip element to the wire element is performed by sticking or by welding. Device 14 for fixing wire element 6 can thus be a welding unit or a sticking unit.

Figure 6:
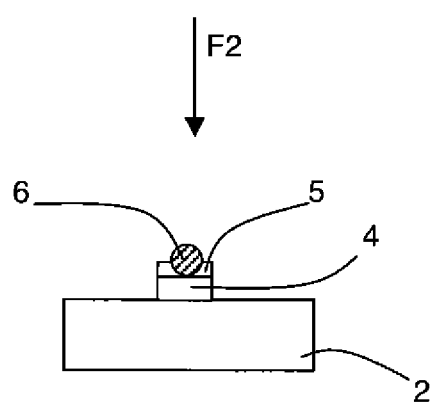
FIG. 6 illustrates a chip element of a particular type associated with a wire element.

In the case where the top of bump 4 of the, or of, each connection terminal 3 of the, or of, each chip element 1 is covered by a different material 5 from bump 4 (FIG. 2), the fixing step of wire element 6 can be performed by modification of said material 5 at least partially making the electric contact between bump 4 and wire element 6 (FIG. 6), after fixing, and fixing of wire element 6 to bump 4.

In the alternative embodiment using fixing by welding in combination with bump 4, the top of which is covered by a material 5 different from bump 4, material 5 at the top of bump 4 wets an external surface of wire element 6 during the welding step, and after cooling secures wire element 6 to connection terminal 3 while at the same time making the electric contact.

In the variant by sticking in combination with bump 4 the top of which is covered by a material 5 different from bump 4, material 5 at the top of bump 4 is a polymer charged with electrically conducting particles. In this case, the fixing step comprises mechanical stressing (arrow $F_2$ of FIG. 6) between wire element 6 and said material 5 so as to compress said material 5 between wire element 6 and bump 4 to perform an electric contact between bump 4 and wire element 6 by pinching of an electrically conducting particle of material 5, or of a cluster of electrically conducting particles of material 5. A cluster then corresponds to a set of particles electrically secured to one another. Advantageously, the polymer also performs fixing of wire element 6 to bump 4.

Among the types of polymers that can be envisaged in the scope of the above embodiment, it is possible to use anisotropic conducting glues. The polymers will then be able to be of Anisotropic Conductive Film (ACF), Anisotropic Conductive Adhesive (ACA), or Isotropic Conductive Adhesive (ICA) type.

According to an embodiment applicable to welding or to sticking in the variant with material 5 covering the top of bump 4, during the fixing step of wire element 6 on connection terminal 3, wire element 6 is securely held, by stressing in the direction of bump 4, against material 5, which is advantageously in solid phase, and is heated to perform fixing by softening of said material 5 due to the heat obtained by heating between wire element 6 and bump 4. After softening and establishment of the electric contact, the material can be cooled to fix the assembly, securing advantageously being preserved during cooling to fix the assembly. In the installation, this can for example be implemented by an element 14a, 14b designed to heat wire element 6 in assembly area $Z_1$ at the time fixing is performed, element 14a, 14b thus being able to form part of the device for fixing 14. For example an element designed to heat can be of laser, infrared furnace, or induction type, etc. Advantageously, element 14a 14b used for heating wire element 6 also enables wire element 6 to be biased in the direction of bump 4 by bearing against said wire element 6.

In FIG. 4, assembly area $Z_1$ is distinct from coating area $Z_2$. This embodiment enables the throughput to be increased in so far as when a chip element 1b is subjected to the coating step, the next chip element 1a undergoes the fixing step. The assembly and coating areas can naturally also be common, in this particular case device for fixing 14 (and advantageously element 14a, 14b designed to heat wire element 6) and device 10 for depositing coating material are retractable with respect to one another to enable either one to work or the other to work in the common area.

Wire element 6 is advantageously always tensioned. In addition, tensioning of wire element 6 prevents the latter from tangling and makes it easier to control the distance between two chip elements 1 fixed onto a single wire element 6. Furthermore, tensioning facilitates the transfer movement of chip element 1 consecutively to its association with wire element 6. In other words, in the example of FIG. 4, the chip elements can be moved to assembly area $Z_1$ by a first conveyor 9, and once fixing has been performed, chip element 1 can leave the first conveyor (i.e. no longer be in contact with the first conveyor), and it is wire element 6 which acts as second conveyor to transport for example chip element 1 to coating area $Z_2$. According to the installation of FIG. 4 and its variants, the continuous tension of the wire element can be implemented by making a supply reel 16 performing supply of wire element 6 cooperate with a winding system 18 at the end of the assembly line. Winding system 18 acts for example as a storage unit of a daisy chain of chip elements in wound form to prevent wire element 6 from becoming entangled. Furthermore, as wire element 6 equipped with its different chip elements is in wound form, winding system 18 can, at the end of the assembly line, be separated from the installation to be directly reused as supply reel in another installation configured to handle the daisy chain.

A chip element provided with a connection terminal has been described above, the chip element naturally being able to comprise at least two connection terminals according to the refinements set out above. It is thus possible to associate a distinct wire element with each connection terminal, in order for example to perform data transit or provision of a current source to supply the chip elements. Advantageously, the connection terminal or terminals will be located on the same surface (preferably the main surface) of the base of the chip element. According to a variant, one or more connection terminals can be located on different surfaces (advantageously opposite main surfaces) of the chip element, each surface bearing a connection terminal being, when the method is performed, at least partially covered by addition of the coating material so as to form two different covers, or a total coating of the chip element forming a single cover.

In the scope of use of several wire elements, the person skilled in the art will understand that the devices of the installation, in particular to perform the fixing and coating step, will be adapted to the situation.

Figure 7:
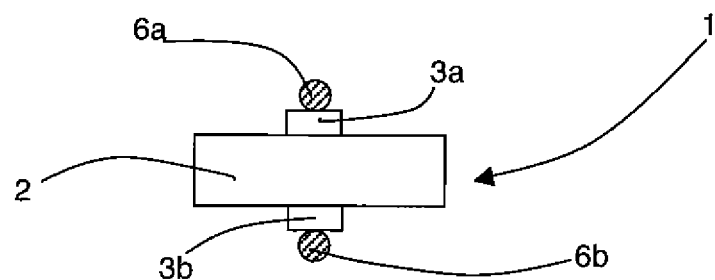
FIG. 7 illustrates a variant of a chip element associated with two distinct wire elements.

According to an alternative embodiment illustrated in FIG. 7, chip element 1 comprises two connection terminals 3a, 3b as described above arranged on two opposite surfaces of base 2 of chip element 1. These two opposite surfaces are preferably main surfaces as defined previously. The fixing step can then comprise fixing of two (advantageously parallel) wire elements 6a, 6b respectively on first terminal 3a and on second terminal 3b, and addition of material designed to form the cover can be performed in two stages on one of the two surfaces and then on the other surface. This assembly advantageously enables the volume around the two wire elements 6a, 6b to be better distributed.

The chip elements can comprise RFID components, or diodes designed to generate light, with a view to respectively forming an intelligent fabric, or a fabric able to display patterns or information by lighting.

Cover 13 further enables the moisture resistance of chip element 1 to be improved, in which case chip element 1 is advantageously completely covered by the material designed to form cover 13 in coating area $Z_2$.

According to an alternative embodiment of the coating area that is not represented, after fixing, the chip element is presented in the coating area via its surface comprising the connection terminal fixed to the wire element to face a reserve of liquid designed to form the cover. The chip element is then moved towards the liquid so that the latter wets the wire element and is then moved up to the surface of the base bearing the connection terminal to perform the material addition step.

The chip elements will advantageously be presented one after the other in the assembly area at a throughput rate enabling them to be fixed to the wire element compatible with the speed of running of said wire element to ensure an ideal separating distance between the chip elements fixed to said wire element.

Advantageously, at the level of the chip element, the wire element is partially sunk.

In the method, fabrication of a cover at the level of the chip element enables selective coating of each chip of the daisy chain to be performed. This enables a flexibility of the wire element on each side of the chip element concerned to be preserved to in particular facilitate braiding of the daisy chain (in this case, the electrically insulating material forming cover 13 advantageously does not coat wire element 6 between two adjacent chip element on account of the selective deposition on the chip element), or any other type of future use of the daisy chain. In addition, selecting the surface equipped with the connection terminal and on which the coating material will be directly placed enables fabrication costs to be reduced.

To enhance fixing of the wire element to the connection terminal, the use of a connection terminal provided with a bump and with a different material, designed to facilitate and improve the electric contact, arranged at the top of the bump, has been described in the foregoing. According to an alternative embodiment, the connection terminal can be formed solely by the bump and the different material can either form an integral part of the wire element which then comprises a core covered by the different material, or it can be arranged locally on the wire element before the fixing step. When the fixing step associated with the different material locally deposited on the wire element is performed, the portion of wire element provided with this local deposition is then brought to face the bump of the chip element to be fixed, and this local deposition is placed in contact with the top of the bump when fixing is performed. The different embodiments associated with the different material designed to facilitate and improve the electric contact as set out in the foregoing apply to this variant.

According to a variant that is not represented, the wire element can be fixed to the connection terminal by ultrasonic welding or by friction.

According to FIG. 4, the material addition step is performed before wire element 6 is stored in storage device 18. However, according to a variant, depending on the running speeds of wire element 6, and the treatment times in the assembly area and in the coating area, it may be advantageous to perform intermediate storage between the assembly and coating areas. A storage step of wire element 6, on which at least one chip element 1 is fixed, in storage device 18 can then be performed before the material addition step.

The invention claimed is:

1. A method for assembling a microelectronic chip element on an electrically conducting wire element, the method comprising the following steps:
   providing a transfer system that includes a wire element supply device and a wire element storage device,
   the wire element being continuously connected to the wire element supply device and to the wire element storage device, the wire element supply device delivering the wire element to an assembly area, and the wire element storage device receiving the wire element from the assembly area, and
   the assembly area being located between the wire element supply device and the wire element storage device,
   tensioning the wire element in the assembly area such that the wire element is stretched between the wire element supply device and the wire element storage device,
   providing a reservoir of individualized and separated chip elements, each chip element comprising a connection terminal, the connection terminal of each chip element including a top that faces away from the chip element,
   transporting a chip element of the individualized and separated chip elements from the reservoir to the assembly area,
   fixing the connection terminal of the chip element to the wire element in the assembly area such that the wire element is stretched before the chip element is fixed to the wire element, and
   adding an electrically insulating material on the chip element after the chip element has been fixed to the wire element, the electrically insulating material forming a cover on the chip element,
      the electrically insulating material being added on a surface of the chip element that includes the connection terminal fixed to the wire element so that the electrically insulating material covers at least the connection terminal and a portion of the wire element at a fixing point, the fixing point being located between the wire element and the connection terminal.

2. The method according to claim 1, wherein a series of chip elements are selectively transported from the reservoir one after the other to the assembly area so as to form a daisy chain after the series of chip elements have passed through the assembly area, the daisy chain being formed by the series of chip elements fixed to the wire element and spaced out along the wire element.

3. The method according to claim 1, wherein the electrically insulating material is added to the chip element by a nozzle that is configured to provide a jet of the electrically insulating material.

4. The method according to claim 1, wherein the step of fixing the chip element to the wire element is performed by sticking.

5. The method according to claim 1, wherein the step of fixing the chip element to the wire element is performed by welding.

6. The method according to claim 1, wherein the step of adding the electrically insulating material on the chip element is calculated so as to homogenize a volume of an assembly formed by the cover, a segment of the wire element sunk in the cover and the chip element around the axis of the wire element.

7. The method according to claim 1, wherein the step of adding the electrically insulating material on the chip element is performed before the wire element is stored in the wire element storage device.

8. The method according to claim 1, further comprising storing the wire element, on which at least one chip element is fixed, in the wire element storage device being performed before the adding step of the electrically insulating material on the chip element.

9. The method according to claim 1, wherein the wire element provides a support for the chip element after the connection terminal of the chip element is fixed to the wire element such that the wire element moves the chip element to the wire element storage device.

10. A method for assembling a microelectronic chip element on an electrically conducting wire element, the method comprising the following steps:
providing a transfer system of the wire element that includes a wire element supply device and a wire element storage device of the wire element,
stretching of the wire element between the wire element supply device and the wire element storage device by a tensioning device,
providing a reservoir of individualized and separated chip elements, each chip element comprising a connection terminal, a bump making the electric connection with a chip of the chip element, and a material different from the bump and covering the top of the bump,
the connection terminal of each chip element including a top that faces away from the chip element,
transporting a chip element of the individualized and separated chip elements from the reservoir to an assembly area located between the wire element supply device and the wire element storage device in such a way that the wire element is tightly stretched in the assembly area,
fixing the connection terminal of the chip element to the wire element in the assembly area by modification of the material at the top of the bump and by at least partially ensuring the electric contact between the bump and the wire element, and
adding an electrically insulating material on the chip element to form a cover, the electrically insulating material is added after the chip element has been fixed to the wire element, and is performed on a surface of the chip element that includes the connection terminal fixed to the wire element so as to cover at least the connection terminal and a portion of the wire element at a fixing point between the wire element and the connection terminal.

11. The method according to claim 10, wherein the step of fixing the chip element to the wire element is performed by sticking, and the material at the top of the bump is a polymer charged with electrically conducting particles, and the step of fixing the chip element to the wire element comprises mechanical stressing between the wire element and the polymer so as to compress the polymer between the wire element and the bump to make an electric contact between the bump and the wire element by pinching of an electrically conducting particle of the polymer, or of a cluster of electrically conducting particles of the polymer.

12. The method according to claim 10, wherein the step of fixing the chip element to the wire element is performed by welding, and the material at the top of the bump wets an external surface of the wire element during the welding step.

13. The method according to claim 12, further comprising, during the step of fixing the wire element onto the connection terminal, securing of the wire element against the material by biasing the wire element in the direction of the bump and heating the wire element to soften the material.

* * * * *